United States Patent
Liu et al.

(10) Patent No.: US 8,111,057 B2
(45) Date of Patent: Feb. 7, 2012

(54) CASCODE CURRENT MIRROR CIRCUIT, BANDGAP CIRCUIT, REFERENCE VOLTAGE CIRCUIT HAVING THE CASCODE CURRENT MIRROR CIRCUIT AND THE BANDGAP CIRCUIT, AND VOLTAGE STABILIZING/REGULATING CIRCUIT HAVING THE REFERENCE VOLTAGE CIRCUIT

(75) Inventors: Chi-En Liu, Taipei (TW); Jean-Fu Kiang, Taipei (TW)

(73) Assignee: National Taiwan University, Taipei (TW)

( * ) Notice: Subject to any disclaimer, the term of this patent is extended or adjusted under 35 U.S.C. 154(b) by 626 days.

(21) Appl. No.: 12/185,276

(22) Filed: Aug. 4, 2008

(65) Prior Publication Data
US 2009/0267585 A1 Oct. 29, 2009

(30) Foreign Application Priority Data
Apr. 25, 2008 (TW) .............................. 97115197 A

(51) Int. Cl.
G05F 3/16 (2006.01)
(52) U.S. Cl. ........................................ 323/313; 327/539
(58) Field of Classification Search .................. 323/312, 323/313, 314, 315, 316, 317; 327/539
See application file for complete search history.

(56) References Cited

U.S. PATENT DOCUMENTS

| | | | |
|---|---|---|---|
| 6,967,525 B2* | 11/2005 | Price, Jr. | 327/542 |
| 6,972,550 B2* | 12/2005 | Hong | 323/315 |
| 2007/0152649 A1* | 7/2007 | Liu | 323/315 |

* cited by examiner

*Primary Examiner* — Harry Behm
*Assistant Examiner* — Matthew Grubb

(57) ABSTRACT

A cascode current mirror circuit and a bandgap circuit are provided. The circuits are used together and function as a reference voltage circuit. The reference voltage circuit outputs a reference current resistant to temperature variation and ripple-voltage. Accordingly, a voltage stabilizing/regulating circuit corrects error voltage precisely and promptly, and the resultant voltage is temperature insensitive and ripple-voltage-independent.

6 Claims, 5 Drawing Sheets

CASCODE CURRENT MIRROR CIRCUIT, BANDGAP CIRCUIT, REFERENCE VOLTAGE CIRCUIT HAVING THE CASCODE CURRENT MIRROR CIRCUIT AND THE BANDGAP CIRCUIT, AND VOLTAGE STABILIZING/REGULATING CIRCUIT HAVING THE REFERENCE VOLTAGE CIRCUIT

BACKGROUND OF THE INVENTION

1. Field of the Invention

The present invention relates to voltage regulator circuits, and more specifically, to a voltage regulator circuit for RF signals.

2. Description of Related Art

Radio frequency identification system is an automatic identification method that involves affixing a small electronic tag to a product which may be checked and monitored by a device known as "reader" which in turn transmits the data stored in the electronic tag back to the system via a wireless RF means, thus achieving remote authentication, tracking, control, management and handling.

The electronic tags can be categorized into two general varieties, passive or active. In particular, passive RFID tags have no internal power supply. The minute electrical current induced in the antenna by the incoming radio-frequency (RF) signal provides just enough power for the CMOS integrated circuit in the tag to power up and transmit a response.

Upon receiving the RF signal by the antenna of passive RFID tags, a rectifier is used to convert the RF signal to a DC voltage level first and subsequently the capacitors are charged repeatedly to increase the DC voltage to a sufficient level for the next stage of circuit operation.

However, after the rectifier converts the RF signal to a DC voltage level, the voltage level is often perturbed by ripple effect or fluctuates easily due to the effect of external temperature. Hence, a passive RFID tag usually requires a voltage regulator circuit design to mitigate the effects of ripple perturbation or external temperature.

Referring to FIG. 1, a schematic of the first conventional voltage regulator circuit is illustrated. As illustrated in the diagram, the front end of voltage regulator circuit has four diodes to avoid damages to the backend due to excessive input power. The uniqueness of the reference voltage circuit is its multi-stage current mirror cascode and that the NMOS operates in the sub-threshold region, thereby decreasing the operating power consumption.

However, the aforementioned circuit structure does not take into account of the effect that the environment temperature has on the voltage regulator circuit; therefore, such a circuit structure does not include components that generate negative temperature coefficient and is unable to mitigate the effect that the external temperature has on the voltage regulator circuit, thereby limiting the applications of such a voltage regulator circuit.

Referring to FIG. 2, a schematic of the second conventional voltage regulator circuit is shown. As illustrated in the diagram, a zero is generated by the internal circuit of the voltage regulator circuit for the purpose of frequency compensation, thereby replacing the conventional way of using the equivalent series resistor of the backend circuit for providing zero compensation. Hence the transient response of the voltage regulator as well as the noise interference at the backend of the circuit are significantly reduced.

However, the aforesaid circuit structure does not take into account of the effect that ripples of the original RF signals have on the voltage regulator circuit. In addition, the error amplifier design does not adopt the cascode connection, therefore during operation, the perturbation of the voltage regulator circuit caused by ripple voltages cannot be avoided.

In summary, it has become an urgent issue to designers of the RF circuit design field to propose a circuit with voltage regulation function that generates a reference current free from temperature effect and ripple voltage perturbation, thereby providing a precise error voltage calibration and shortening the calibration time for calibrating the voltage regulator circuit errors. Furthermore, regulation of a voltage level free of temperature effect as well as the ripple voltage perturbation is achieved.

SUMMARY OF THE INVENTION

In view of the disadvantages of the above-mentioned conventional technique, a primary objective of the present invention is to provide a reference voltage circuit, wherein it includes a cascode current mirror and a bandgap circuit. PNP transistors and two resistors connected in series are used to mitigate the temperature effect as well as the ripple voltage perturbation. The aforementioned cascode current mirror circuit and bandgap circuit are used together to form a reference voltage circuit, thereby using such a reference voltage circuit to generate a reference current free from temperature effect and ripple voltage perturbation.

Another objective of the present invention is to provide a voltage-regulating operational amplifier circuit for precise calibration of voltage errors and reduction of the time required for calibrating the voltage regulator circuit, thereby generating a voltage level free from the temperature effect as well as the ripple voltage perturbation.

In order to achieve the above-mentioned objectives, the present invention provides a cascode current mirror circuit wherein it has: a first PMOS transistor, a second PMOS transistor, a third PMOS transistor, and a fourth PMOS transistor; a first NMOS transistor, a second NMOS transistor, a third NMOS transistor and a fourth NMOS transistor; a first resistor having a first resistor terminal and a second resistor terminal; a second resistor having a third resistor terminal and a fourth resistor terminal.

A drain of the first PMOS transistor is connected to a source of the second PMOS transistor, and a drain of the third PMOS transistor is connected to a source of the fourth PMOS transistor. Also, a gate of the first PMOS transistor is connected to a gate of the third PMOS transistor to form a first gate connection node. A gate of the second PMOS transistor is connected to a gate of the fourth PMOS transistor to form a second gate connection node.

A drain of the first NMOS transistor is connected to a source of the second NMOS transistor, and a drain of the third NMOS transistor is connected to a source of the fourth NMOS transistor. Also, a gate of the first NMOS transistor is connected to a gate of the third NMOS transistor to form a third gate connection node. A gate of the second NMOS transistor is connected to a gate of the fourth NMOS transistor to form a fourth gate connection node.

The first gate connection node and a drain of the second PMOS transistor are connected to the first resistor terminal. The second gate connection node and a drain of the second NMOS transistor are connected to the second resistor terminal. Also, the third gate connection node and a drain of the fourth NMOS transistor are connected to the third resistor terminal. The fourth gate connection node and a drain of the fourth PMOS transistor are connected to the fourth resistor terminal.

In order to achieve the aforementioned objective, the present invention also provides a bandgap circuit wherein it includes: a first PMOS transistor, a second PMOS transistor, a first NMOS transistor, a second NMOS transistor, a third NMOS transistor, a first NPN transistor and a second NPN transistor.

In the bandgap circuit, a gate of the first PMOS transistor, a gate of the second PMOS transistor, a drain of the first PMOS transistor and a drain of the first NMOS transistor are connected together. In addition, a gate of the first NMOS transistor, a gate of the second NMOS transistor, a drain of the second PMOS transistor, and a drain of the second NMOS transistor in the bandgap circuit are connected together.

An emitter of the first NPN transistor is connected to an emitter of the second NPN transistor. In addition, a collector of the first NPN transistor is connected to a source of the first NMOS transistor. A collector of the second NPN transistor is connected to a source of the second NMOS transistor. In addition, a drain of the third NMOS transistor is connected to the emitter of the first NPN transistor as well as the emitter of the second NPN transistor.

In order to achieve the foregoing objective, the present invention further provides a reference voltage circuit, wherein it includes: a PNP transistor having a third resistor with a fifth resistor terminal and a sixth resistor terminal, a fourth resistor with a seventh resistor terminal and an eighth resistor terminal, a fifth PMOS transistor and a sixth PMOS transistor; in addition, a drain of the fifth PMOS transistor is connected to a source of the sixth PMOS transistor. Also a drain of the sixth PMOS transistor is connected to the fifth resistor terminal.

The reference voltage circuit further includes the above-described cascode current mirror circuit and bandgap circuit. In particular, the first gate connection node of the cascode current mirror circuit is connected to a gate of the fifth PMOS transistor. In addition, the second gate connection node of the cascode current mirror circuit is connected to a gate of the sixth PMOS transistor. Also a base of a first NPN transistor is connected to an emitter of the PNP transistor and the eighth resistor terminal. A base of a second NPN transistor is connected to the sixth resistor terminal and the seventh resistor terminal. The gate of the third NMOS transistor of the bandgap circuit is connected to the third gate connection node of the cascode current mirror circuit, and the drain of the sixth PMOS transistor is connected to the fifth resistor terminal to form the reference voltage output terminal.

Finally, the reference voltage circuit is connected to a current source and a ground terminal: a source of the first PMOS transistor of the cascode current mirror circuit, a source of the third PMOS transistor of the cascode current mirror circuit, a source of the first PMOS transistor of the bandgap circuit, a source of the second PMOS transistor of the bandgap circuit as well as a source of the fifth PMOS transistor are connected to the current source.

The base of the PNP transistor, the collector of the PNP transistor, a source of the first NMOS transistor of the cascode current mirror, a source of the third NMOS transistor of the cascode current mirror, a source of the third NMOS transistor of the bandgap circuit were connected to the ground terminal.

Hence, the reference voltage circuit makes use of the PNP transistor and two series resistors to mitigate the temperature effect as well as the ripple voltage perturbations. The aforesaid cascode current mirror and the bandgap circuit co-work with each other to form a reference voltage circuit, which generates a reference voltage free from the effect of temperature and the ripple voltage perturbation.

In order to achieve the aforementioned objective, the present invention provides an operational amplifier (OP Amp) circuit wherein the OP Amp has a first PMOS transistor, a second PMOS transistor, a third PMOS transistor, a fourth PMOS transistor, a first NMOS transistor, a second NMOS transistor and a third NMOS transistor.

A drain of the first PMOS transistor of the operational amplifier circuit is connected to a source of the second PMOS transistor. In addition, a drain of the third PMOS transistor is connected to a source of the fourth PMOS transistor. Also a gate of the first PMOS transistor is connected to a gate of the third PMOS transistor to form a first gate connection node, and a gate of the second PMOS transistor is connected to a gate of the fourth PMOS transistor to form a second gate connection node.

Furthermore, a drain of the first NMOS transistor is connected to a drain of the second PMOS transistor and the first gate connection node. A drain of the second NMOS transistor is connected to a drain of the fourth PMOS transistor. A source of the first NMOS transistor and a source of the second NMOS transistor are connected to a drain of the third NMOS transistor.

The operational amplifier circuit is further connected to the aforementioned reference voltage circuit. In addition, the second gate connection node of the operational amplifier circuit is connected to the gate of the sixth PMOS transistor of the reference voltage circuit. In addition, the reference voltage output terminal of the reference voltage circuit is connected to a gate of the first NMOS transistor of the operational amplifier circuit, and a gate of the second NMOS transistor is the voltage output terminal.

Also, the amplifier circuit having the voltage regulation function further includes a load unit. The load unit includes a first load resistor having a first load resistor terminal and a second load resistor terminal, a second load resistor having a third load resistor terminal and a fourth load resistor terminal, a third load resistor having a fifth load resistor terminal and a sixth load resistor terminal, and a capacitor having a first capacitor terminal and a second capacitor terminal.

The first load resistor terminal is connected to the fifth load resistor terminal and the first capacitor terminal. The second load resistor terminal is connected to the third load resistor terminal. The second load resistor terminal is connected to the third load resistor terminal to form a voltage-receiving terminal. Also the voltage-receiving terminal is connected to the voltage output terminal.

Finally, the voltage regulator circuit further includes a PMOS auxiliary transistor, a current source, an operating bias voltage source and a ground terminal.

A drain of the PMOS auxiliary transistor is connected to the first load resistor terminal, and a gate of the PMOS auxiliary transistor is connected to the drain of the second NMOS transistor. The operating bias voltage source is connected to a gate of the third NMOS transistor of the operational amplifier circuit.

Also, the current source is connected to the source of the first PMOS transistor and the source of the third PMOS transistor of the cascode current mirror circuit, the source of the first PMOS transistor and the source of the second PMOS transistor of the bandgap circuit, the source of the fifth PMOS transistor of the reference voltage circuit, a source of the first PMOS transistor and a source of the third PMOS transistor of the operational amplifier circuit, as well as a source of the PMOS auxiliary transistor.

The ground terminal is connected to the source of the first NMOS transistor and the source of the third NMOS transistor of the cascode current mirror circuit, the source of the third NMOS transistor of the bandgap circuit, the collector and the base of the PNP transistor of the reference voltage circuit, a source of the third NMOS transistor of the operational amplifier circuit, the fourth load resistor terminal, the sixth load resistor terminal as well as the second capacitor terminal.

Based on the above information, it is known that the voltage regulator circuit of the present invention, together with the cascode current mirror circuit, the bandgap circuit, the PNP transistor, and the two series resistors, mitigate the temperature effect and the ripple voltage perturbation, thereby forming a reference voltage circuit. The reference voltage circuit is in turn used to generate a reference current free from the temperature effect as well as the ripple voltage perturbation, thereby allowing the operational amplifier circuit to perform precise voltage error calibration. The time required for calibrating the voltage regulator circuit error is also reduced and the voltage of the signal after regulated by the voltage regulator circuit of the present invention is free from the effect of temperature and the ripple voltage perturbation.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

The following embodiments further illustrate the points of the present invention in detail, however the scope of the invention is not limited to any points.

Figure 1:
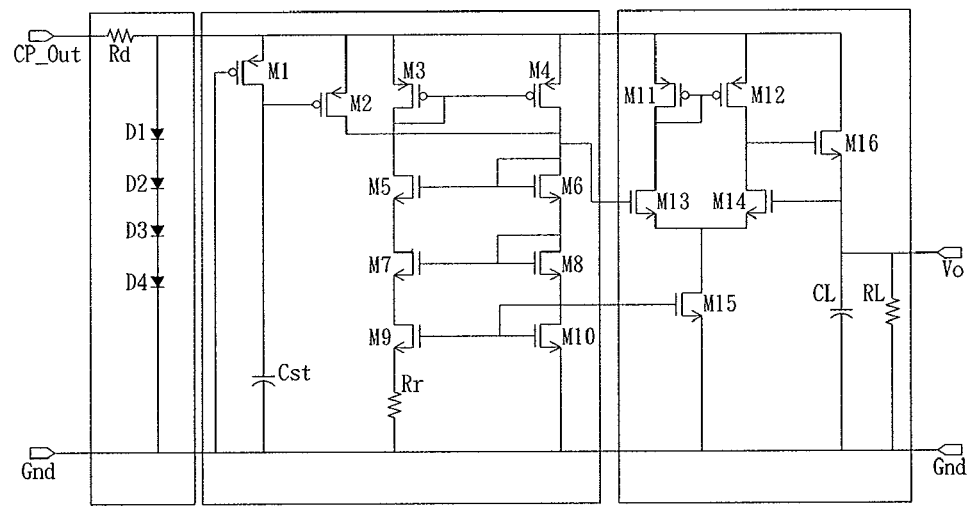
FIG. 1 is a diagram illustrating a circuit structure of a first conventional voltage regulator circuit.
Figure 2:
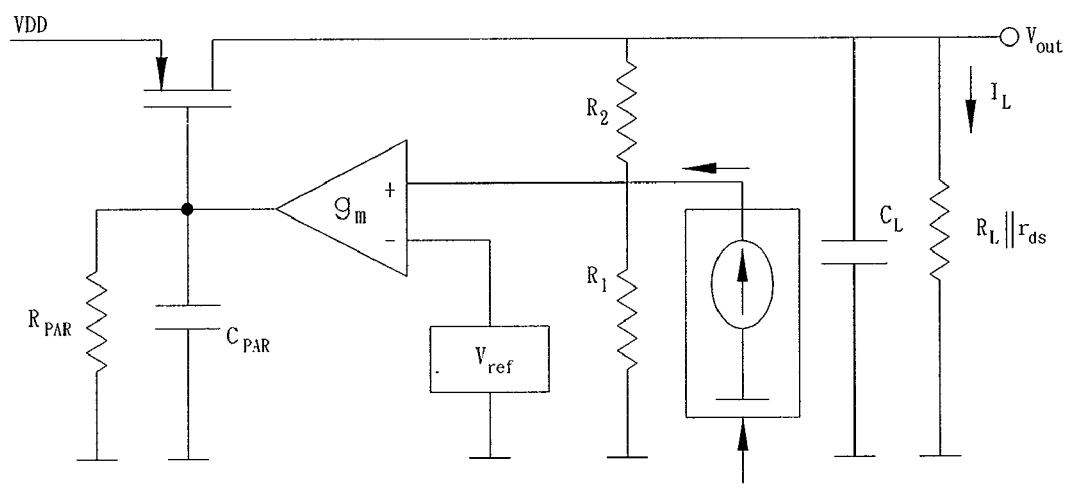
FIG. 2 is a diagram illustrating a circuit structure of a second conventional voltage regulator circuit.
Figure 3:
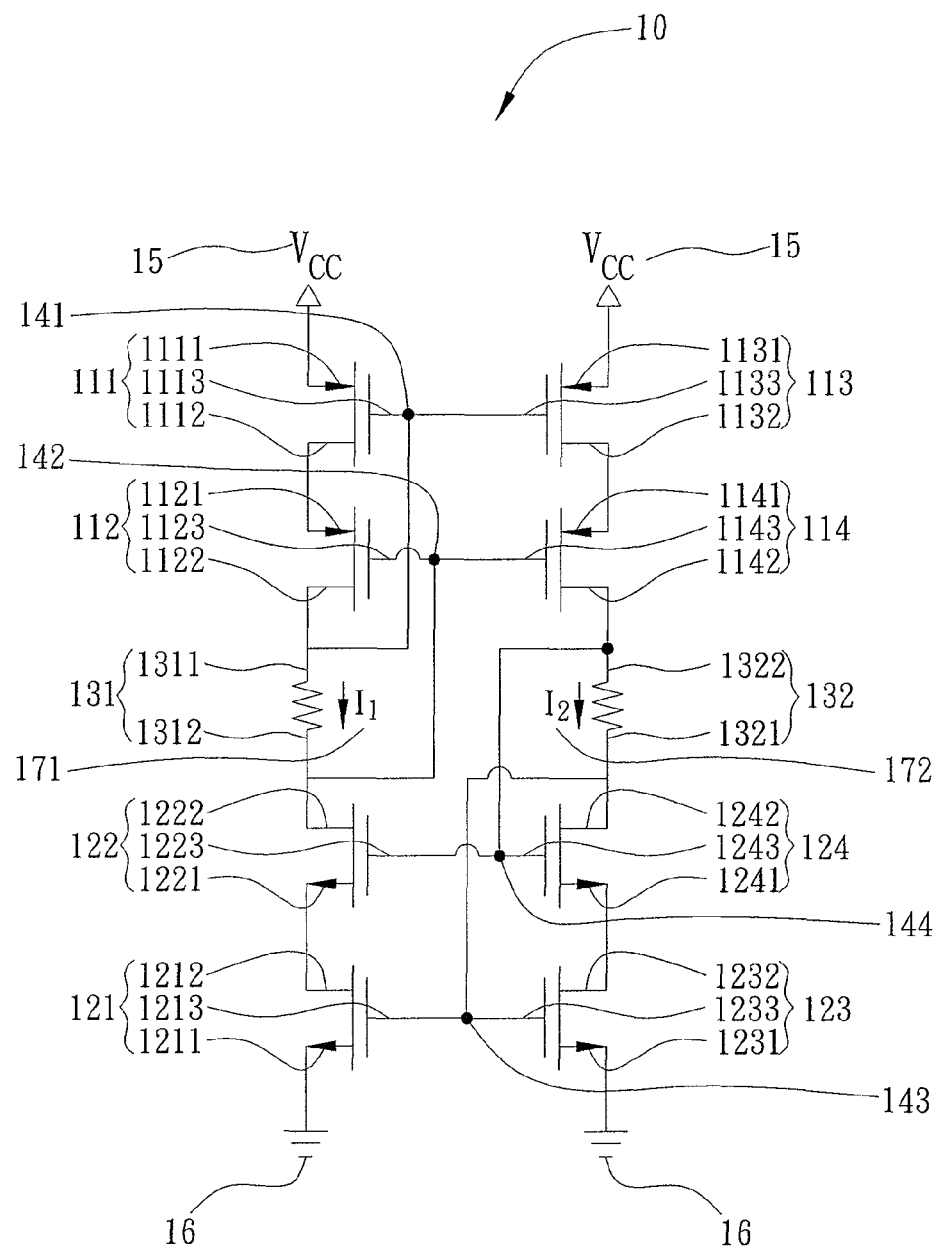
FIG. 3 is a diagram showing a cascode current mirror circuit of the present invention.

Referring to FIG. 3, a structure of a cascode current mirror circuit of the present invention is shown. A cascode current mirror circuit 10 of the present invention includes: a first PMOS transistor 111, a second PMOS transistor 112, a third PMOS transistor 113, and a fourth PMOS transistor 114, a first NMOS transistor 121, a second NMOS transistor 122, a third NMOS transistor 123 and a fourth NMOS transistor 124; a first resistor 131 having a first resistor terminal 1311 and a second resistor terminal 1312; a second resistor 132 having a third resistor terminal 1321 and a fourth resistor terminal 1322.

Also the first PMOS transistor 111 has a source 1111, a drain 1112, and a gate 1113; the second PMOS transistor 112 has a source 1121, a drain 1122, and a gate 1123; the third PMOS transistor 113 has a source 1131, a drain 1132, and a gate 1133; the fourth PMOS transistor 114 has a source 1141, a drain 1142 and a gate 1143.

The first NMOS transistor 121 has a source 1211, a drain 1212, and a gate 1213; the second NMOS transistor 122 has a source 1221, a drain 1222, and a gate 1223; the third NMOS transistor 123 has a source 1231, a drain 1232, and a gate 1233; the fourth NMOS transistor 124 has a source 1241, a drain 1242 and a gate 1243.

The drain 1112 of the first PMOS transistor 111 is connected to the source 1121 of the second PMOS transistor 112, and the drain 1132 of the third PMOS transistor 113 is connected to the source 1141 of the fourth PMOS transistor 114. Also, the gate 1113 of the first PMOS transistor 111 is connected to the gate 1133 of the third PMOS transistor 113 to form a first gate connection node 141. The gate 1123 of the second PMOS transistor 112 is connected to the gate 1143 of the fourth PMOS transistor 114 to form a second gate connection node 142.

The drain 1212 of the first NMOS transistor 121 is connected to the source 1221 of the second NMOS transistor 122, and the drain 1232 of the third NMOS transistor 123 is connected to the source 1241 of the fourth NMOS transistor 124. Also, the gate 1213 of the first NMOS transistor 121 is connected to the gate 1233 of the third NMOS transistor 123 to form a third gate connection node 143. The gate 1223 of the second NMOS transistor 122 is connected to the gate 1243 of the fourth NMOS transistor 124 to form a fourth gate connection node 144.

The first gate connection node 141 and the drain 1122 of the second PMOS transistor 112 are connected to the first resistor terminal 1311. The second gate connection node 142 and the drain 1222 of the second NMOS transistor 122 are connected to the second resistor terminal 1312. Also, the third gate connection node 143 and the drain 1242 of the fourth NMOS transistor 124 are connected to the third resistor terminal 1321. The fourth gate connection node 144 and the drain 1142 of the fourth PMOS transistor 114 are connected to the fourth resistor terminal 1322.

Also the cascode current mirror circuit 10 further includes a current source 15 and a ground terminal 16. The source 1111 of the first PMOS transistor 111 and the source 1131 of the third PMOS transistor 113 are connected to the current source 15. In addition, the source 1211 of the first NMOS transistor 121 and the source 1231 of the third NMOS transistor 123 are connected to the ground terminal.

Therefore, the cascode current mirror circuit 10 generates a first current 171 ($I_1$) flowing through the first resistor 131 and a second current 172 ($I_2$) flowing through the second resistor 132.

In particular, suppose that $R_1$ is the resistance of the first resistor, $V_{th1}$ is the threshold voltage of the first PMOS transistor, and $V_{th2}$ is the threshold voltage of the second PMOS transistor, the first current value 171 $I_1$ is calculated such that $I_1$ is within the range of $$\frac{|V_{th2} - V_{th1}|}{R_1} \langle I_1 \langle \frac{|V_{th2}|}{R_1}.$$

Likewise, if $R_2$ is the resistance of the second resistor, $V_{th3}$ is the threshold voltage of the third NMOS transistor, and $V_{th4}$ is the threshold voltage of the fourth NMOS transistor, then the second current value 172 $I_2$ is calculated such that $I_2$ is within the range of $$\frac{|V_{th4} - V_{th3}|}{R_2} \langle I_2 \langle \frac{|V_{th4}|}{R_2}.$$

Based on such circuit layouts, characteristics of the current mirror circuit and the circuit theory, it is known that the cascode current mirror circuit 10 of the present invention generates stable first current 171 and second current 172, thereby lowering the ripple signal perturbation.

Figure 4:
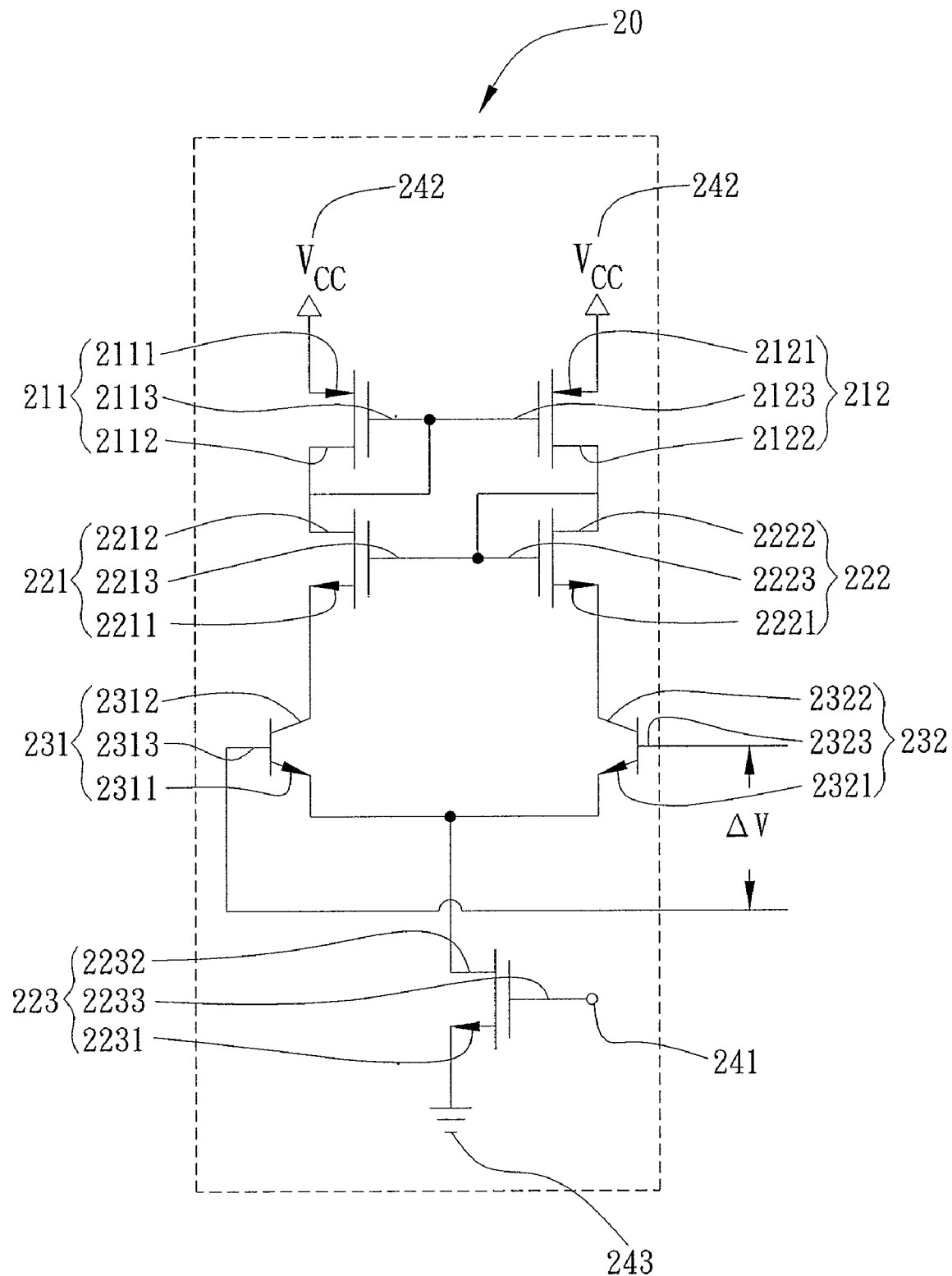
FIG. 4 illustrates a structure of a bandgap circuit according to the present invention.

FIG. 4 illustrates a structure of a bandgap circuit of the present invention. A bandgap circuit 20 of the present invention includes: a first PMOS transistor 211, a second PMOS transistor 212, a first NMOS transistor 221, a second NMOS transistor 222, a third NMOS transistor 223, a first NPN transistor 231 and a second NPN transistor 232.

In particular, the first PMOS transistor 211 has a source 2111, a drain 2112 and a gate 2113; the second PMOS transistor 212 has a source 2121, a drain 2122 and a gate 2123.

The first NMOS transistor 221 has a source 2211, a drain 2212, and a gate 2213; the second NMOS transistor 222 has a source 2221, a drain 2222, and a gate 2223; the third NMOS transistor 223 has a source 2231, a drain 2232, and a gate 2233.

The first NPN transistor 231 has an emitter 2311, a collector 2312 and a base 2313; the second NPN transistor 232 has an emitter 2321, a collector 2322 and a base 2323.

Also the gate 2113 of the first PMOS transistor 211, the gate 2123 of the second PMOS transistor 212, the drain 2112 of the first PMOS transistor 211 and the drain 2212 of the first NMOS transistor 221 are connected together. In addition, the gate 2213 of the first NMOS transistor 221, the gate 2223 of the second NMOS transistor 222, the drain 2122 of the second PMOS transistor 212, and the drain 2222 of the second NMOS transistor 222 are connected together.

The emitter 2311 of the first NPN transistor 231 is connected to the emitter 2321 of the second NPN transistor 232. In addition, the collector 2312 of the first NPN transistor 231 is connected to the source 2211 of the first NMOS transistor 221. The collector 2322 of the second NPN transistor 232 is connected to the source 2221 of the second NMOS transistor 222. In addition, the drain 2232 of the third NMOS transistor 223 is connected to the emitter 2311 of the first NPN transistor 231 as well as the emitter 2321 of the second NPN transistor 232.

Finally, the bandgap circuit 20 further includes an operating bias voltage source 241, a current source 242 and a ground terminal 243, and the current source 242 is connected to the source 2111 of the first PMOS transistor 211 and the source 2121 of the second PMOS transistor 212; the ground terminal 243 is connected to the source 2231 of the third NMOS transistor 223; the operating bias voltage source 241 is connected to the gate 2233 of the third NMOS transistor 223.

The bandgap circuit 20 according to the present invention allows the base 2313 of the first NPN transistor 231 to function with the base 2323 of the second NPN transistor 232, thereby forming an emitter-base voltage threshold ($\Delta V_{BE}$) having a characteristic of positive temperature coefficient.

Figure 5:
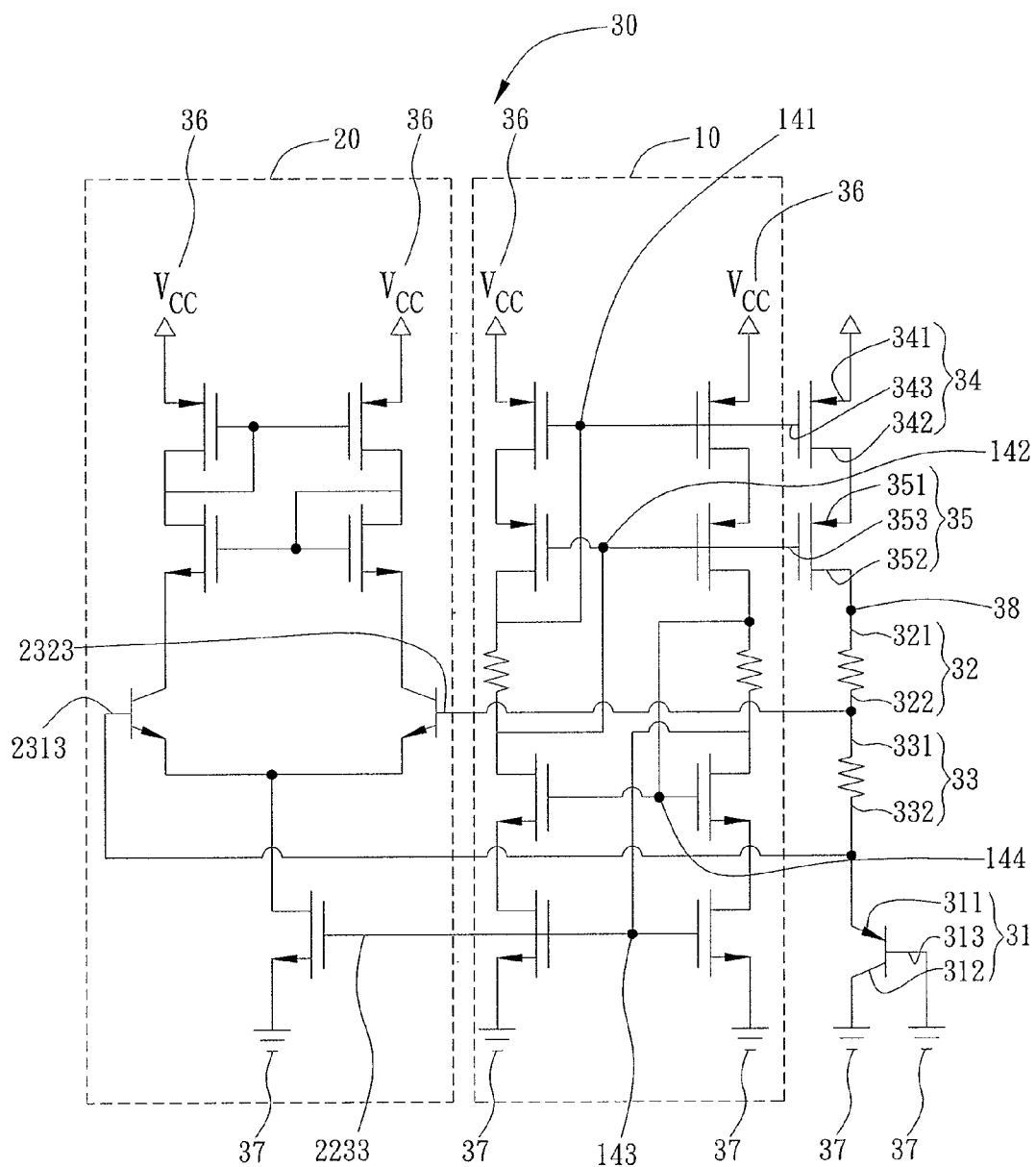
FIG. 5 shows a structure of a reference voltage circuit of the present invention.

Referring to FIG. 5, a structure of a reference voltage circuit according to the present invention is illustrated. The characteristic of the reference voltage circuit 30 according to the present invention is that the reference voltage circuit uses the aforementioned cascode current mirror circuit 10 and the bandgap circuit 20 to avoid being affected by the ripple effect and the temperature perturbation, thereby achieving a reference voltage circuit 30 that provides a stable reference voltage.

The reference voltage circuit 30 of the present invention includes: a PNP transistor 31, a third resistor 32, a fourth resistor 33, a fifth PMOS transistor 34, a sixth PMOS transistor 35, and the aforementioned cascode current mirror circuit 10 and the aforementioned bandgap circuit 20.

In particular, the PNP transistor 31 includes an emitter 311, a collector 312, and a base 313, the third resistor 32 has a fifth resistor terminal 321 and a sixth resistor terminal 322, a fourth resistor 33 has a seventh resistor terminal 331 and an eighth resistor terminal 332, a fifth PMOS transistor 34 has a source 341, a drain 342 and a gate 343, and a sixth PMOS transistor 35 has a source 351, a drain 352, and a gate 353.

In addition, the drain 342 of the fifth PMOS transistor 34 is connected to the source 351 of the sixth PMOS transistor 35. Also the drain 352 of the sixth PMOS transistor 35 is connected to the fifth resistor terminal 321.

The first gate connection node 141 of the cascode current mirror circuit 10 is connected to the gate 343 of the fifth PMOS transistor 34. In addition, the second gate connection node 142 of the cascode current mirror circuit 10 is connected to the gate 353 of the sixth PMOS transistor 35. Also the base 2313 of the first NPN transistor 231 of the bandgap circuit 20 is connected to the emitter 311 of the PNP transistor 31 and the eighth resistor terminal 332. The base 2323 of the second NPN transistor 232 is connected to the sixth resistor terminal 322 and the seventh resistor terminal 331. The gate 2233 of the third NMOS transistor 223 of the bandgap circuit 20 is connected to the third gate connection node 143 of the cascode current mirror circuit 10.

The reference voltage circuit 30 of the present invention further includes a current source 36, a ground terminal 37 and a reference voltage output terminal 38. In particular, the source 1111 of the first PMOS transistor 111 of the cascode current mirror circuit 10, the source 1131 of the third PMOS transistor 113 of the cascode current mirror circuit 10, the source 2111 of the first PMOS transistor 211 of the bandgap circuit 20, the source 2211 of the second PMOS transistor 221 of the bandgap circuit 20 as well as the source 341 of the fifth PMOS transistor 34 are connected to the current source 36.

The base 313 of the PNP transistor 31, the collector 312 of the PNP transistor 31, the source 1211 of the first NMOS transistor 121 of the cascode current mirror 10, the source 1231 of the third NMOS transistor 123 of the cascode current mirror 10, the source 2231 of the third NMOS transistor 223 of the bandgap circuit 20 were connected to the ground terminal 37.

In summary, the reference voltage circuit 30 of the present invention with the PNP transistor 31, the third resistor 32, the fourth resistor 33, the fifth PMOS transistor 34, the sixth PMOS transistor 35, the aforementioned cascode current mirror circuit 10 and the aforementioned bandgap circuit 20 is connected to the current source 36 and the ground terminal 37. The drain 352 of the sixth PMOS transistor 35 is connected to the fifth resistor terminal 321 to form the reference voltage output terminal 38, thereby outputting a stable reference voltage level free from ripple perturbation and the effect due to temperature variation.

Figure 6:
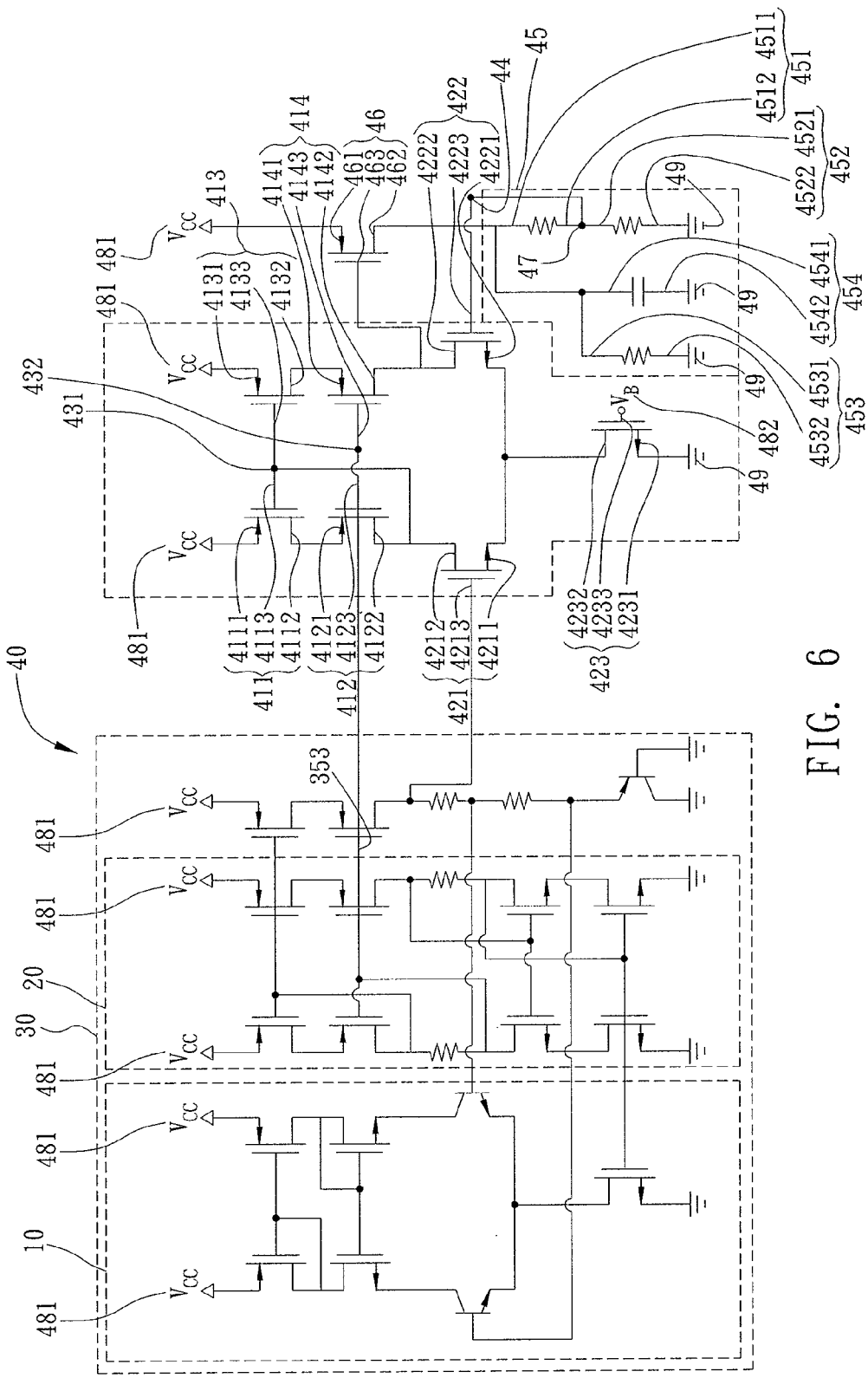
FIG. 6 is a diagram showing an operational amplifier circuit of the present invention.

Referring to FIG. 6, a structure of the voltage regulator circuit according to the present invention is shown. An operational amplifier circuit 40 of the present invention uses the aforementioned reference voltage circuit 30 to stably output a reference voltage level that is free from ripple perturbation and temperature interference.

The present invention provides the operational amplifier (OP Amp) circuit 40 wherein the operational amplifier circuit has a first PMOS transistor 411, a second PMOS transistor 412, a third PMOS transistor 413, a fourth PMOS transistor 414, a first NMOS transistor 421, a second NMOS transistor 422 and a third NMOS transistor 423.

In particular, the first PMOS transistor 411 has a source 4111, a drain 4112, and a gate 4113; the second PMOS transistor 412 has a source 4121, a drain 4122, and a gate 4123; the third PMOS transistor 413 has a source 4131, a drain 4132, and a gate 4133; the fourth PMOS transistor 414 has a source 4141, a drain 4142, and a gate 4143.

The first NMOS transistor 421 has a source 4211, a drain 4212, and a gate 4213; the second NMOS transistor 422 has a source 4221, a drain 4222 and a gate 4223; the third NMOS transistor 423 has a source 4231, a drain 4232, and a gate 4233. Specifically in the present embodiment, the gate 4223 of the second NMOS 422 is used as a voltage output terminal 44.

The drain 4112 of the first PMOS transistor 411 is connected to the source 4121 of the second PMOS transistor 412. In addition, the drain 4132 of the third PMOS transistor 413 is connected to the source 4141 of the fourth PMOS transistor 414. Also the gate 4113 of the first PMOS transistor 411 is connected to the gate 4133 of the third PMOS transistor 413 to form a first gate connection node 431, and the gate 4123 of the second PMOS transistor 412 is connected to the gate 4143 of the fourth PMOS transistor 414 to form a second gate connection node 432.

Furthermore, the drain 4212 of the first NMOS transistor 421 is connected to the drain 4122 of the second PMOS transistor 412 and the first gate connection node 431. The drain 4222 of the second NMOS transistor 422 is connected to the drain 4142 of the fourth PMOS transistor 414. The source 4211 of the first NMOS transistor 421 and the source 4221 of the second NMOS transistor 422 are connected to the drain 4232 of the third NMOS transistor 423.

The second gate connection node 432 of the operational amplifier circuit 40 of the present invention is further connected to the gate 353 of the sixth PMOS transistor 35 of the reference voltage circuit 30. In addition, the reference voltage output terminal 38 of the reference voltage circuit 30 is connected to the gate 4213 of the first NMOS transistor 421 of the operational amplifier circuit 40.

Also, the operational amplifier circuit 40 of the present invention further includes a load unit 45 and a PMOS auxiliary transistor 46 having a source 461, a drain 462 and a gate 463. In addition, the load unit 45 is connected to the voltage output terminal 44 for receiving the voltage level outputted from the voltage output terminal 44.

In particular, the aforementioned load unit 45 further includes a first load resistor 451 having a first load resistor terminal 4511 and a second load resistor terminal 4512, a second load resistor 452 having a third load resistor terminal 4521 and a fourth load resistor terminal 4522, a third load resistor 453 having a fifth load resistor terminal 4531 and a sixth load resistor terminal 4532, and a capacitor 454 having a first capacitor terminal 4541 and a second capacitor terminal 4542.

The first load resistor terminal 4511 is connected to the fifth load resistor terminal 4531 and the first capacitor terminal 4541. The second load resistor terminal 4512 is connected to the third load resistor terminal 4521 to form a voltage-receiving terminal 47. Also the voltage-receiving terminal 47 is connected to the voltage output terminal 44 for receiving the voltage level output from the voltage output terminal 44.

The drain 462 of the PMOS auxiliary transistor 46 is connected to the first load resistor terminal 4511, and the gate 463 of the PMOS auxiliary transistor 46 is connected to the drain 4222 of the second NMOS transistor 422.

Based on the above circuit layout, the operational amplifier circuit 40 of the present invention includes a current source 481, an operating bias voltage source 482 and a ground terminal 49. In particular, the operating bias voltage source 482 is connected to the gate 4233 of the third NMOS transistor 423 of the operational amplifier circuit 40 of the present invention.

The current source 481 is connected to the source 1111 of the first PMOS transistor 111 and the source 1131 of the third PMOS transistor 113 of the cascode current mirror circuit 10, the source 2111 of the first PMOS transistor 211 and the source 2121 of the second PMOS transistor 212 of the bandgap circuit 20, the source 341 of the fifth PMOS transistor 34 of the reference voltage circuit 30 of the present invention, the source 4111 of the first PMOS transistor 411 and the source 4131 of the third PMOS transistor 413 of the operational amplifier circuit 40, as well as the source 461 of the PMOS auxiliary transistor 46.

The ground terminal 49 is connected to the source 1211 of the first NMOS transistor 121 and the source 1231 of the third NMOS transistor 123 of the cascode current mirror circuit 10, the source 2231 of the third NMOS transistor 223 of the bandgap circuit 20, the collector 312 and the base 313 of the PNP transistor 31 of the reference voltage circuit 30 of the present invention, the source 4231 of the third NMOS transistor 423 of the operational amplifier circuit 40 of the present invention, the fourth load resistor terminal 4522, the sixth load resistor terminal 4532 as well as the second capacitor terminal 4542.

Based on the above information, it is known that the operational amplifier circuit 40 of the present invention, together with the cascode current mirror circuit 10, the bandgap circuit 20, and the reference voltage circuit 30 generate a reference current free from the temperature effect as well as the ripple voltage perturbation, thereby allowing the operational amplifier circuit 40 of the present invention to perform precise voltage error calibration. The time required for calibrating the voltage regulator circuit error is also shortened and the voltage level after being regulated by the voltage regulator circuit of the present invention is free from the effect of temperature and the ripple voltage perturbation.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A bandgap circuit comprising:
   a first PMOS transistor, a second PMOS transistor, a first NMOS transistor, and a second NMOS transistor, wherein a gate of the first PMOS transistor, a gate of the second PMOS transistor, a drain of the first PMOS transistor and a drain of the first NMOS transistor are interconnected, and a gate of the first NMOS transistor, a gate of the second NMOS transistor, a drain of the second PMOS transistor, and a drain of the second NMOS transistor are interconnected;
   a first NPN transistor and a second NPN transistor wherein an emitter of the first NPN transistor is connected to an emitter of the second NPN transistor, a collector of the first NPN transistor is connected to a source of the first NMOS transistor, and a collector of the second NPN transistor is connected to a source of the second NMOS transistor; and a third NMOS transistor, wherein a drain of the third NMOS transistor is connected to the emitter of the first NPN transistor and the emitter of the second NPN transistor; and a third NMOS transistor, wherein a drain of the third NMOS transistor is connected to the emitter of the first NPN transistor and the emitter of the second NPN transistor.

2. The bandgap circuit of claim 1, wherein a base of the first NPN transistor and a base of the second NPN transistor form a base-emitter voltage.

3. The bandgap circuit of claim 1, further comprising a current source and a ground terminal.

4. The bandgap circuit of claim 3, wherein the current source is connected to a source of the first PMOS transistor and a source of the second PMOS transistor, and the ground terminal is connected a source of the third NMOS transistor.

5. The bandgap circuit of claim 4, further comprising an operating bias voltage source.

6. The bandgap circuit of claim 5, wherein the operating bias voltage source is connected to a gate of the third NMOS transistor.

* * * * *